(12) United States Patent
Wittmann

(10) Patent No.: US 9,778,317 B2
(45) Date of Patent: Oct. 3, 2017

(54) SYSTEM FOR MONITORING THE OPERATION OF A CURRENT LOOP

(71) Applicant: ZUMTOBEL LIGHTING GMBH, Lemgo (DE)

(72) Inventor: Gerhard Wittmann, Munich (DE)

(73) Assignee: ZUMTOBEL LIGHTING GMBH, Dornbirn (AT)

( * ) Notice: Subject to any disclaimer, the term of this patent is extended or adjusted under 35 U.S.C. 154(b) by 35 days.

(21) Appl. No.: 14/435,054

(22) PCT Filed: Oct. 9, 2013

(86) PCT No.: PCT/EP2013/071019
§ 371 (c)(1),
(2) Date: Apr. 10, 2015

(87) PCT Pub. No.: WO2014/056967
PCT Pub. Date: Apr. 17, 2014

(65) Prior Publication Data
US 2015/0219719 A1    Aug. 6, 2015

(30) Foreign Application Priority Data

Oct. 10, 2012    (DE) .................. 10 2012 218 429

(51) Int. Cl.
*G01R 31/327* (2006.01)
*H01H 9/16* (2006.01)
(Continued)

(52) U.S. Cl.
CPC ........... *G01R 31/327* (2013.01); *G01R 19/14* (2013.01); *H01H 9/167* (2013.01); *H01H 3/022* (2013.01);
(Continued)

(58) Field of Classification Search
CPC ....... G01R 31/327; G01R 19/14; H01H 9/167
(Continued)

(56) References Cited

U.S. PATENT DOCUMENTS

| 4,607,247 A | 8/1986 | Sterling, Jr. et al. | |
| 6,298,837 B1 * | 10/2001 | Ketterer | F02P 9/002 |
| | | | 123/609 |

(Continued)

FOREIGN PATENT DOCUMENTS

| DE | 3112314 | 10/1982 |
| DE | 3908558 | 9/1990 |

(Continued)

OTHER PUBLICATIONS

International Search Report for PCT/EP2013/071019, English translation attached to original, Both completed by the European Patent Office dated Jan. 15, 2014, All together 5 Pages.

*Primary Examiner* — Jermele M Hollington
*Assistant Examiner* — Christopher McAndrew
(74) *Attorney, Agent, or Firm* — Brooks Kushman P.C.

(57) ABSTRACT

In a system for monitoring the operation of a current loop, which is fed by a current source and has a switching element, an evaluation unit is arranged at the output of the current loop, which evaluation unit is designed to identify a state of the switching element on the basis of the current flowing in the current loop. Furthermore, a signal generation device is arranged in the current loop, which signal generation device is connected to the switching element and is designed to generate a dynamic signal characterizing the state of the switching element in the current loop.

4 Claims, 1 Drawing Sheet

(51) Int. Cl.
*G01R 19/14* (2006.01)
*H01H 3/02* (2006.01)
*H02J 13/00* (2006.01)

(52) U.S. Cl.
CPC ......... *H02J 13/0003* (2013.01); *Y02B 90/228* (2013.01); *Y04S 20/18* (2013.01)

(58) Field of Classification Search
USPC ........................................................ 324/415
See application file for complete search history.

(56) References Cited

U.S. PATENT DOCUMENTS

| | | | |
|---|---|---|---|
| 6,646,362 B2 * | 11/2003 | Bert | ................... H01H 1/605 307/130 |
| 6,734,793 B1 | 5/2004 | Dreyer et al. | |
| 7,590,898 B2 | 9/2009 | Coekaerts | |
| 8,248,075 B2 * | 8/2012 | Brannan | ................ A61B 18/18 200/42.01 |
| 2004/0189481 A1 * | 9/2004 | Youssef | ................ H03K 17/18 340/686.1 |
| 2010/0079215 A1 * | 4/2010 | Brannan | ............ A61B 18/1815 333/1.1 |
| 2012/0105065 A1 * | 5/2012 | Namou | .............. G01R 31/3275 324/415 |

FOREIGN PATENT DOCUMENTS

| | | |
|---|---|---|
| DE | 4221916 | 1/1994 |
| DE | 69008917 | 9/1994 |
| DE | 102004021750 | 12/2005 |
| DE | 102007004397 | 7/2008 |
| DE | 102009047099 | 5/2011 |
| EP | 1137024 | 9/2001 |

* cited by examiner

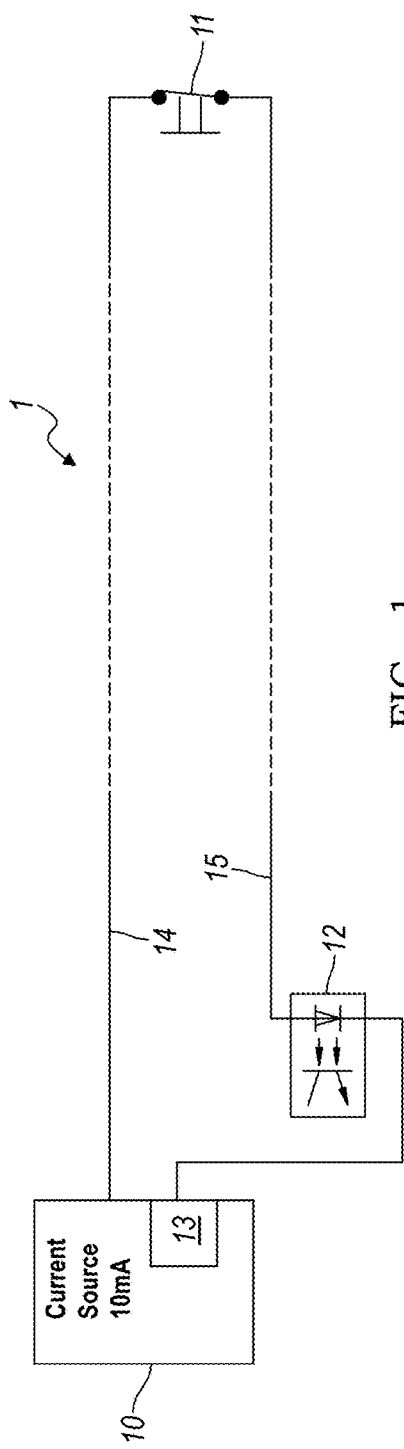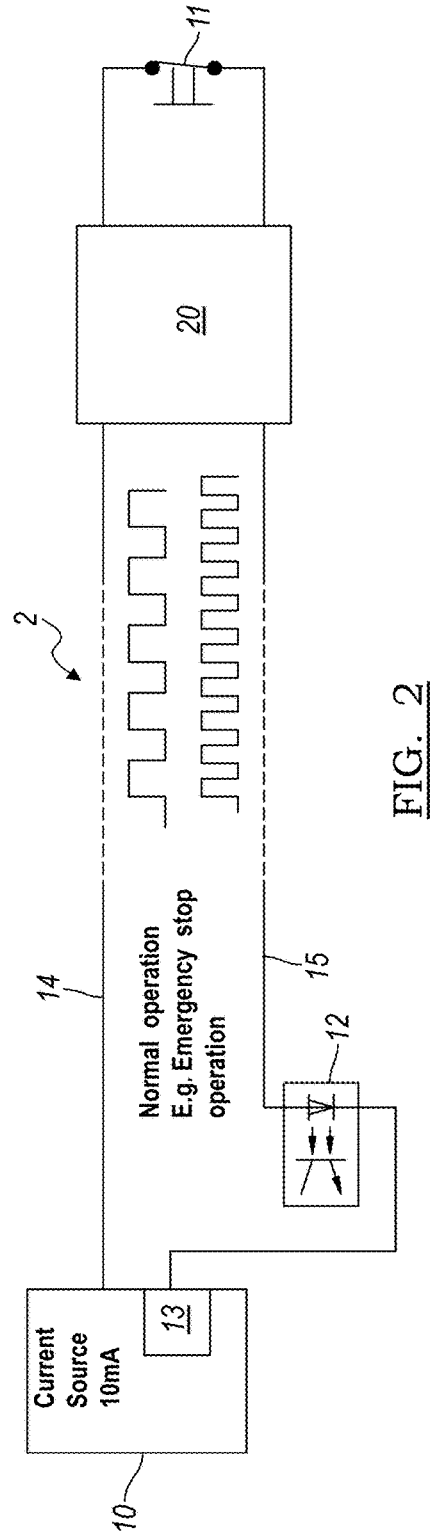

SYSTEM FOR MONITORING THE OPERATION OF A CURRENT LOOP

CROSS-REFERENCE TO RELATED APPLICATION

This application is the U.S. national phase of PCT Application No. PCT/EP2013/071019 filed on Oct. 9, 2013, which claims priority to DE Patent Application No. 10 2012 218 429.5 filed on Oct. 10, 2012, the disclosures of which are incorporated in their entirety by reference herein.

The present invention relates to a system for monitoring the function of a current loop and to a signal generation device used in such a current loop.

Current loops within the meaning of the present invention are used in accordance with the prior art for identifying the state of a switch located in the loop. During normal operation, the loop which is designed correspondingly to the conventional two-wire installation technology, has current flowing through it fed by a current source. The current flow is detected by a correspondingly configured evaluation unit. As soon the current flow is interrupted, for example by actuation of the interruption switch, this interruption of the current flow is identified. With the aid of such a current loop, for example, a so-called emergency stop switch is realized which can be used by the fire services and can be used to deactivate the emergency lighting corresponding to regulations in Italy, for example. Testing of the function of bus phase monitors which are used for monitoring the general power supply and communicate a power failure to an emergency lighting system, is also performed with the aid of such current loops.

One disadvantage with the above-described known solution consists in that disruptions to the transmission of the permanently flowing direct current can result in erroneous interpretation of the switch state. Thus, for example, drilling into the line running in a wall can interrupt the current loop and thus trigger unintentional shutdown of the emergency lighting. In the same way, a short circuit would also result in the state of the switch not being reliably and correctly identified.

It is furthermore known from network technology to use so-called heartbeat signals. In this case, when using a bus system, a specific signalling sequence is transmitted via the bus regularly by each connected device in order to ensure continued accessibility of the respective device. Such a system is disclosed in U.S. Pat. No. 7,590,898 B2. Such signalling is very complex, however, since a bus system and a complex message format are a precondition for this.

The invention is based on the object of specifying an improved solution for realizing a function-monitored current loop which enables reliable distinction between the states of the switching element located in the current loop with little complexity.

In the system according to the invention as well, a current loop is fed by a current source and has a switching element, wherein an evaluation unit is arranged at the output of the current loop, which evaluation unit is designed to identify a switching state of the switching element on the basis of the current flowing in the current loop. In accordance with the invention, furthermore a signal generation device is now arranged in the current loop, which signal generation device is connected to the switch and is designed to generate a dynamic signal characterizing the switching state of the switching element in the current loop.

In accordance with the solution according to the invention provision is therefore made for the state of the switching element to be converted into a dynamic signal by an additional element, said dynamic signal in turn being evaluated by the evaluation unit, but giving clearly reliable information on the state of the switching element and in particular also making it possible to identify faults in the function of the current loop. In this case, the signal generated by the signal generation device can be in particular a pulsed signal, which is preferably generated by virtue of the fact that the signal generation device temporarily short-circuits the loop current. The signal generation device can then be designed to characterize the state of the switching element on the basis of the frequency and/or phase and/or amplitude and/or on the basis of the duty factor of the signal. In this case, the switching element can also be a multiple switch and the signal generation device can be designed to characterized each individual one of the switching states by modifying the signal.

One advantage of the solution according to the invention consists in particular also in that largely existing components of a current loop can be used and only the signal generation device needs to be retrofitted. This is preferably arranged in the direct vicinity of the switching element or forms a unit with the switching element.

The invention will be described by way of example below with reference to the drawing, which illustrates an advantageous exemplary embodiment of the invention and in which:

FIG. 1 shows a current loop in accordance with the prior art; and

FIG. 2 shows an exemplary embodiment of a current loop according to the invention.

First, with reference to FIG. 1, the problem on which the invention is based will be explained on the basis of an exemplary current loop. Then, by means of FIG. 2, the design and mode of operation of an exemplary embodiment of the solution according to the invention is shown.

FIG. 1 shows an exemplary emergency stop switch system 1. It contains a current source 10, a switch 11, an optocoupler 12 and evaluation unit 13, which in the present case is integrated in the current source 10. The current source 10 is in this case connected to the switch 11 via a first line 14. The switch 11 is connected to the optocoupler 12 via a second line 15, the output of said optocoupler being connected to the current source 10 and in particular to the evaluation unit 13.

The current source 10 impresses a direct current into the line 14. The direct current flows through the switch 11 and the line 15 to the optocoupler 12 and from there back to the current source 10 and the evaluation unit 13. Depending on whether the switch 11 is open or closed, a permanent current flow through the loop is enabled or interrupted. This results, depending on the switch state, in a steady-state high or low signal at the output of the optocoupler 12, which is detected by the evaluation unit 13, which identifies a state of the switch 11 in dependence on this signal. For example, by actuation of the switch 11 in the sense of a so-called remote stop, the emergency lighting can then be deactivated in a targeted manner.

In addition to the actuation of the switch 11, however, a large number of further influences can interrupt the current flow through the loop and result in erroneous interpretation of the switch state. Thus, for example, damage to one of the lines 14, 15 could result in an interruption to the current flow. This is disadvantageous since certain functions are thus triggered in an unintended manner. In the same way, a short circuit of the loop can also be present, which in turn results in an incorrect signal at the output of the optocoupler 12, i.e. a signal which does not represent the state of the switch 11.

FIG. 2 shows an exemplary embodiment of a current loop 2 according to the invention. In turn, a current source 10 is provided, which feeds the current loop, with a direct current of 10 mA, for example, and has an evaluation unit 13, which detects and evaluates the output signal of the optocoupler 12. In this regard, the solution according to the invention is therefore equivalent to the current loop in accordance with the prior art and the already existing elements and units can continue to be used.

In addition, a signal generation device 20 is now arranged in the current loop directly at or at least in the vicinity of the switch 11, however. Both elements can also form one unit. In the exemplary embodiment illustrated here, the switch 11 is in the form of an interruption switch. However, it could likewise be in the form of a pushbutton switch or a conventional switch, in particular also a multiple switch. The signal generation device 25 is in this case connected to both poles of the switch 11. In addition, it is connected to the two lines 14, 15 and, via said lines, to the current source 10 and the optocoupler 12, respectively.

The current source 10 again feeds current to the loop, said current being transmitted to the signal generation device 20 via the line 14. Said signal generation device now identifies the switching state of the switch 11 and generates a dynamic signal characterizing the switching state of the switch from the loop current. The energy required for generating this signal is drawn by the signal generation device 20 in this case preferably only from the current of the current loop. Alternatively, the signal generation device 20 can also have an additional power supply, which is not illustrated, however.

The signal generation device 20 generates the signal by virtue of, for example, it short-circuiting the current loop with a defined rhythm, wherein the frequency and/or the duty factor is dependent on the state of the switch 11. For example, during normal operation, a signal with a frequency of 32 Hz could be generated, while the frequency could be significantly increased, for example doubled, during actuation of the switch, on the other hand. In the same way or additionally, the duty factor could also be changed depending on the state of the switch.

The resultant signal at the output of the optocoupler 12 can then be detected and evaluated by the evaluation unit 13 so that said evaluation unit can identify the state of the switch 11 very easily.

In addition, the evaluation unit 13 can also identify whether there is a fault in the current loop. This could be the case if one of the lines 14, 15 is damaged, i.e. interrupted, or there is a short circuit. In this case, again a steady-state signal, which cannot clearly be attributed to the activity of the signal generation device 20 and correspondingly signals that the reliable function of the current loop is not ensured, is present at the output of the optocoupler.

In this case, the switch 11 or the switching element can also be designed in such a way that it can assume more than only two states. In this case, too, provision is made for each of the possible switching states to be identified by the signal generation device and for a corresponding signal to be generated in the current loop. Modifying the current in the loop is then performed at different frequencies and with different duty factors, which each characterize the switch states, therefore.

A substantial advantage of the solution according to the invention consists in that it is largely possible to use the already provided units and only the current loop needs to be retrofitted with the signal generation device. Adaptation of the evaluation unit only needs to be performed to the extent that it now also evaluates the dynamics of the incoming signal, which can generally take place very easily on a software basis, however. The complexity involved in the optimization of the entire system is therefore extremely low.

The invention claimed is:

1. A system for monitoring the function of a current loop, which is fed by a current source and has a switching element, wherein an evaluation unit is arranged at the output of the current loop, which evaluation unit is designed to identify a state of the switching element on the basis of the current flowing in the current loop, wherein furthermore a signal generation device is arranged in the current loop, said signal generation device being connected to the switching element and generating a dynamic signal characterizing the state of the switching element in the current loop, wherein the dynamic signal generated by the signal generation device is one of a plurality of pulsed signals;

wherein the signal generation device generates the pulsed signals by short-circuiting the loop current;

and wherein the switching element is a multiple state switch having more than two states, and the signal generation device characterizes each individual one of the switch states by generating a different one of the plurality of pulsed signals.

2. The system as claimed in claim 1, wherein the signal generation device is designed to characterize the state of the switching element on the basis of the frequency and/or phase and/or amplitude and/or on the basis of the duty factor of the signal.

3. The system as claimed in claim 1, wherein the evaluation unit is designed to identify an interruption to the current loop, a short circuit or disrupted operation on the basis of the frequency and/or phase and/or amplitude and/or on the basis of the duty factor of the signal.

4. The system as claimed in claim 1, wherein the signal generation device is arranged in direct connection with the switching element or forms a unit with the switching element.

* * * * *